US011742037B2

(12) United States Patent
Zhang et al.

(10) Patent No.: US 11,742,037 B2
(45) Date of Patent: Aug. 29, 2023

(54) MEMORY DEVICE AND MULTI-PASS PROGRAM OPERATION THEREOF

(71) Applicant: YANGTZE MEMORY TECHNOLOGIES CO., LTD., Wuhan (CN)

(72) Inventors: Chao Zhang, Wuhan (CN); Yueping Li, Wuhan (CN); Haibo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 182 days.

(21) Appl. No.: 17/352,247

(22) Filed: Jun. 18, 2021

(65) Prior Publication Data

US 2022/0319617 A1 Oct. 6, 2022

Related U.S. Application Data

(63) Continuation of application No. PCT/CN2021/083947, filed on Mar. 30, 2021.

(51) Int. Cl.
*G11C 7/00* (2006.01)
*G11C 16/34* (2006.01)
(Continued)

(52) U.S. Cl.
CPC .......... *G11C 16/3459* (2013.01); *G11C 16/08* (2013.01); *G11C 16/102* (2013.01); *G11C 16/26* (2013.01); *G11C 16/3404* (2013.01)

(58) Field of Classification Search
CPC ....... G11C 7/1078; G11C 7/22; G11C 7/1006; G11C 7/1072; G11C 7/1096
(Continued)

(56) References Cited

U.S. PATENT DOCUMENTS 10,510,413 B1 * 12/2019 Diep .................. G11C 16/3459
10,748,619 B1 * 8/2020 Li ........................... G11C 16/10
(Continued)

FOREIGN PATENT DOCUMENTS

CN 109410998 A 3/2019
CN 111630599 A 9/2020

OTHER PUBLICATIONS

International Search Report issued in corresponding International Application No. PCT/CN2021/083947 dated Jan. 6, 2022, 4 pages.

*Primary Examiner* — Son T Dinh
(74) *Attorney, Agent, or Firm* — Bayes PLLC

(57) ABSTRACT

In certain aspects, a memory device includes a memory cell array having rows of memory cells, word lines respectively coupled to the rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells, such that each of the row of target memory cells is programmed into one of $2^N/m$ intermediate levels based on the piece of N-bits data to be stored in the target memory cell, where m is an integer greater than 1. The peripheral circuit is also configured to program, in a second pass after the first pass, the row of target memory cells, such that each target memory cell is programmed into one of the $2^N$ levels based on the piece of N-bits data to be stored in the target memory cell.

20 Claims, 13 Drawing Sheets

(51) Int. Cl.
　　　*G11C 16/08*　　　(2006.01)
　　　*G11C 16/10*　　　(2006.01)
　　　*G11C 16/26*　　　(2006.01)

(58) Field of Classification Search
　　　USPC ........................................ 365/189.16, 189.14
　　　See application file for complete search history.

(56) References Cited

U.S. PATENT DOCUMENTS

2013/0155769 A1　　6/2013　Li et al.
2022/0415418 A1*　12/2022　Chu .................. G11C 16/3459

* cited by examiner

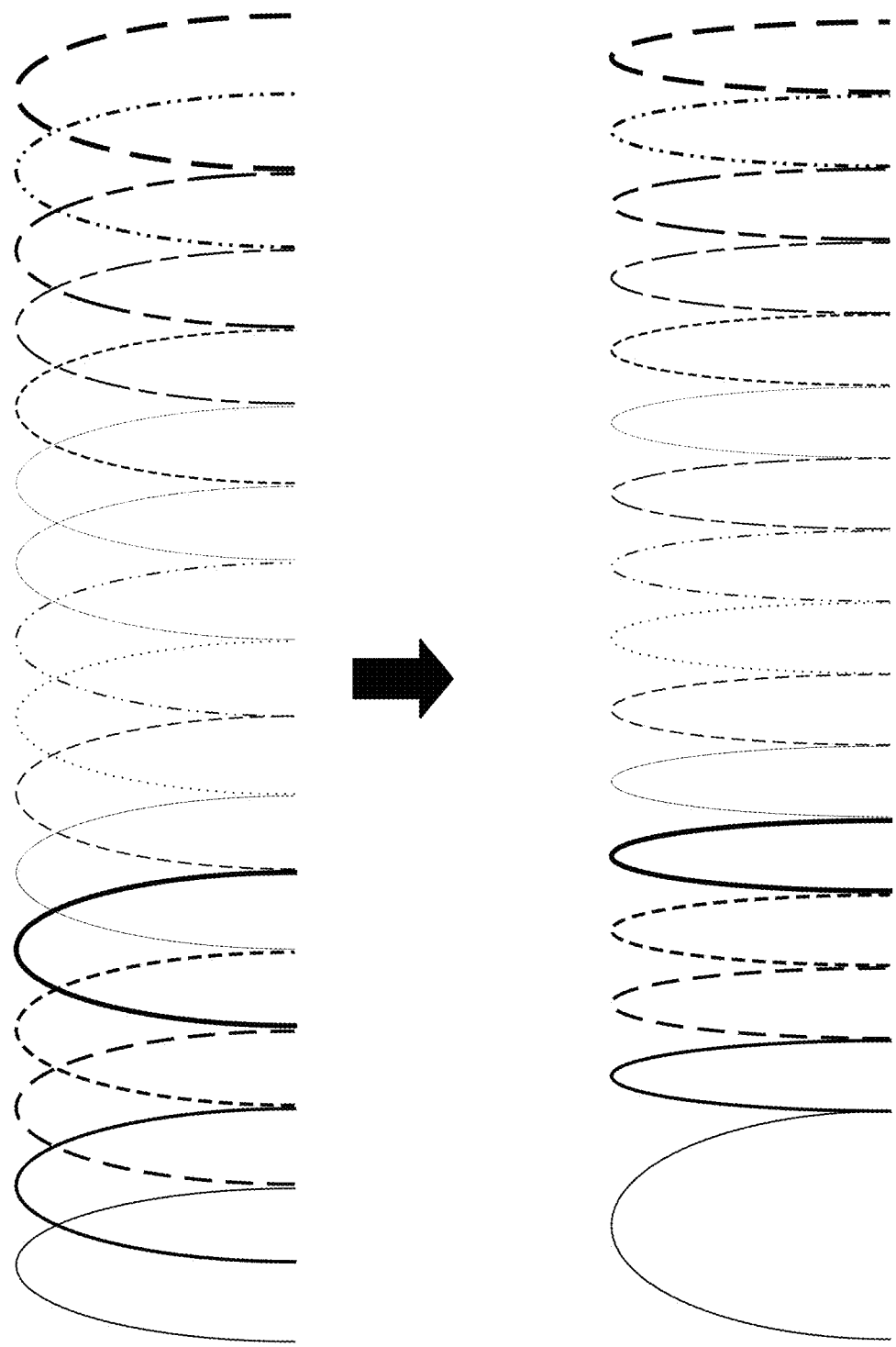

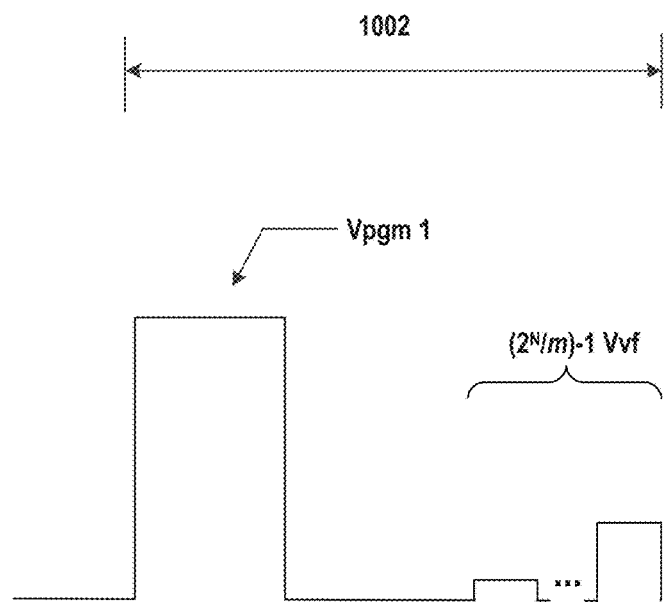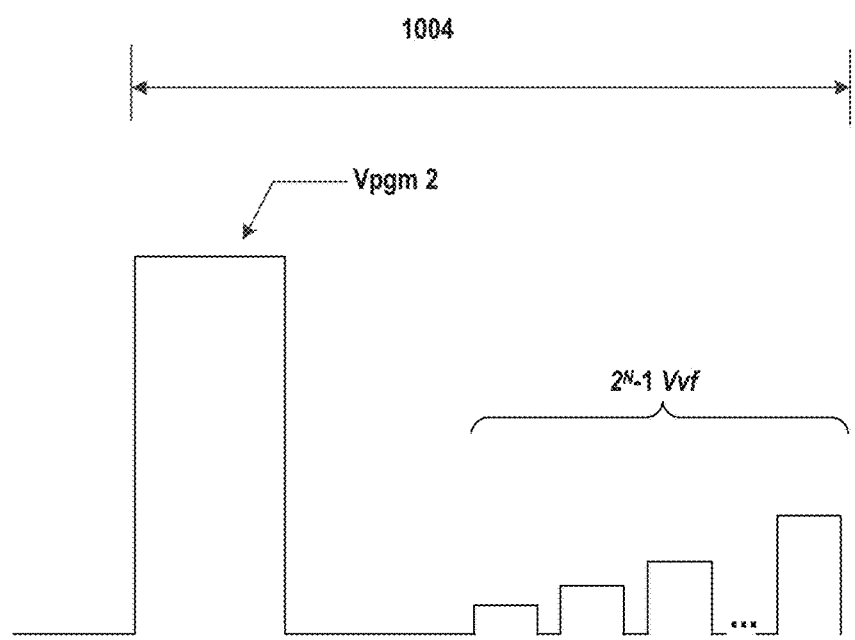
FIG. 10

MEMORY DEVICE AND MULTI-PASS PROGRAM OPERATION THEREOF

CROSS-REFERENCE TO RELATED APPLICATIONS

This application is continuation of International Application No. PCT/CN2021/083947, filed on Mar. 30, 2021, entitled "MEMORY DEVICE AND MULTI-PASS PROGRAM OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of $2^N/m$ intermediate levels based on the piece of N-bits data to be stored in the target memory cell, where m is an integer greater than 1. The peripheral circuit is also configured to program, in a second pass after the first pass, the row of target memory cells, such that each of the row of target memory cells is programmed into one of the $2^N$ levels based on the piece of N-bits data to be stored in the target memory cell.

In another aspect, a system includes a memory device configured to store data and a memory controller coupled to the memory device and configured to control the memory device. The memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of $2^N/m$ intermediate levels based on the piece of N-bits data to be stored in the target memory cell, where m is an integer greater than 1. The peripheral circuit is also configured to program, in a second pass after the first pass, the row of target memory cells, such that each of the row of target memory cells is programmed into one of the $2^N$ levels based on the piece of N-bits data to be stored in the target memory cell.

In still another aspect, a method for operating a memory device is provided. The memory device includes a memory cell array having a plurality of rows of memory cells, and a plurality of word lines respectively coupled to the plurality rows of memory cells. In a first pass, a row of target memory cells of the plurality of rows of memory cells is programmed, such that each of the row of target memory cells is programmed into one of $2^N/m$ intermediate levels based on one of $2^N$ pieces of N-bits data to be stored in the target memory cell, where N and m is each an integer greater than 1. In a second pass after the first pass, the row of target memory cells is programmed, such that each of the row of target memory cells is programmed into one of $2^N$ levels based on the piece of N-bits data to be stored in the target memory cell. The $2^N$ levels correspond to the $2^N$ pieces of N-bits data.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 9 illustrates threshold voltage distributions of memory cells in a multi-pass program operation.

FIG. 10 illustrates an exemplary waveform of word line voltages applied to a selected word line in a multi-pass program operation, according to some aspects of the present disclosure.

Figure 1:
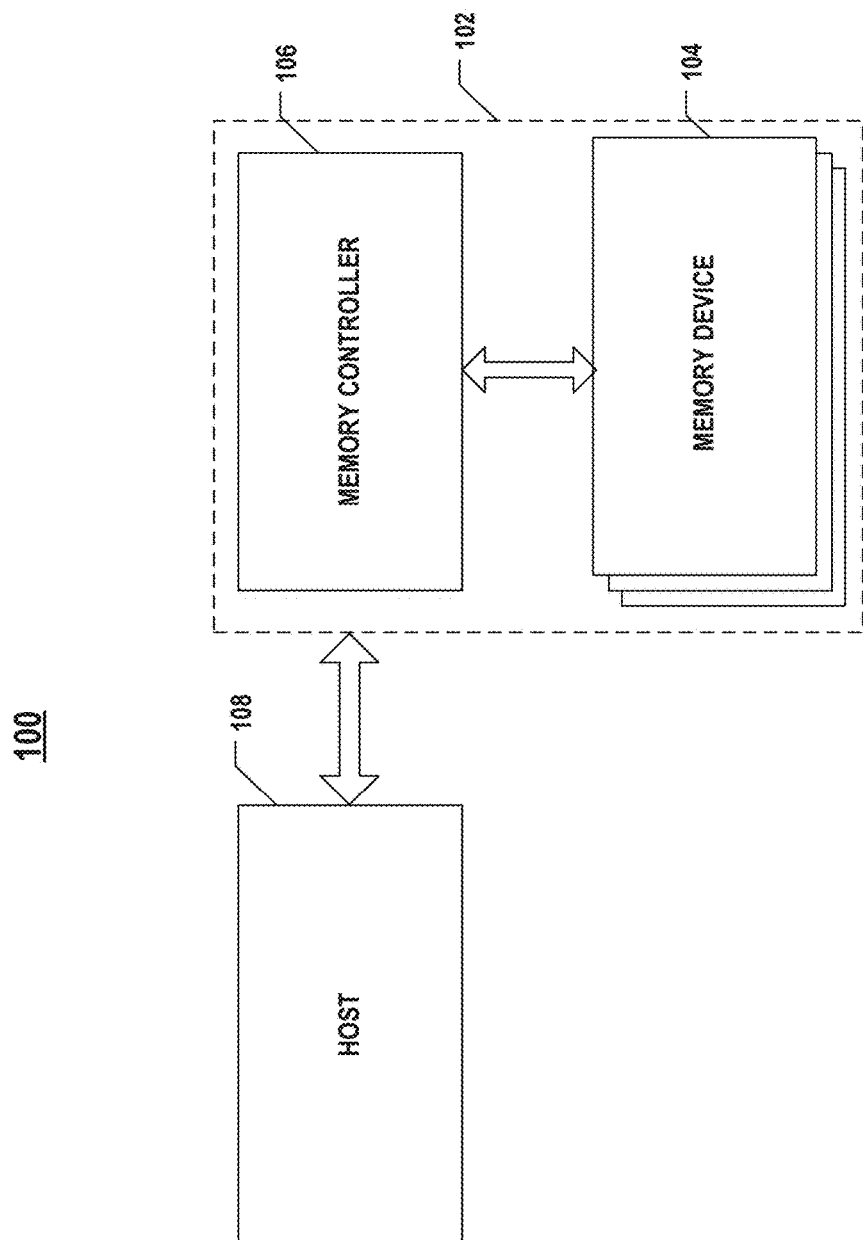
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell in multiple levels (a.k.a., states) in order to increase the storage capacity and reduce the cost per bit. In program operations, the data may be programmed (written) into xLCs, such as multi-level cells (MLCs), trip-level cells (TLCs), quad-level cells (QLCs), etc. For xLCs, for example, QLCs, multi-pass program operations can be used to reduce program time and increase read margin, which involve a coarse program pass that programs the xLCs to one of the intermediate levels, as well as a fine program pass that programs the xLCs from the intermediate levels to the final levels. For example, for QLCs, there are two schemes of two-pass program operations: an 8-16 scheme in which the memory cells are first programmed to 8 levels in the coarse programming, and then programmed to 16 levels in the fine programming; and a 16-16 scheme in which the memory cells are first programmed to 16 levels in the coarse programming, and then reprogrammed to form 16 levels with smaller threshold voltage ranges in the fine programming.

The 16-16 scheme typically has larger read margins and shorter read time, compared with the 8-16 scheme. However, the 16-16 scheme needs to verify the 16 levels individually using 15 coarse verify voltages in the coarse program pass, which makes the 16-16 scheme slower than the 8-16 scheme with the similar number of program loops, since the 8-16 scheme only requires verifying 8 levels in the coarse program pass. The same issues may occur in other $2^N$-$2^N$ schemes for xLCs, where N represents the number of bits of the data stored in each memory cell (e.g., N=4, the 16-16 scheme for QLCs)

To address one or more of the aforementioned issues, the present disclosure introduces a solution in which multiple intermediate levels in a coarse program pass of a multi-pass program operation can be merged into one intermediate level, such that the number of required verify voltages and the associated duration can be reduced in the coarse program pass, thereby increasing the program speed. In some implementations, memory cells to be programmed with different pieces of data (e.g., with different values of gray code) are grouped and verified using the same verify voltage at the same time, as opposed to using multiple verify voltages at different times. As a result, the scheme of multi-pass program operations disclosed herein can increase the program speed of the known $2^N$-$2^N$ scheme (e.g., 16-16 scheme where N=4 for QLC) by reducing the number and duration of verify processes in the coarse program pass, while keeping the larger read margins and shorter read time, compared with the corresponding $2^n$-$2^N$ scheme (where n<N, e.g., n=N−1).

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a NAND Flash memory device, can perform multi-pass program operations in which multiple intermediate levels in the coarse program pass can be grouped and merged into one intermediate level, thereby reducing the verify duration and increasing the program speed. Consistent with the scope of the present disclosure, in a multi-pass program operation, memory cells to be programmed with different pieces of data (e.g., with different values of gray code) are grouped and verified using the same verify voltage at the same time, as opposed to using multiple verify voltages at different times, according to some implementations.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
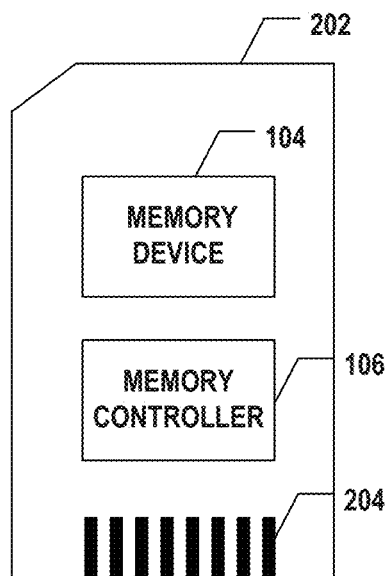
FIG. 2A illustrates a diagram of an exemplary memory card having a memory device, according to some aspects of the present disclosure.
Figure 2B:
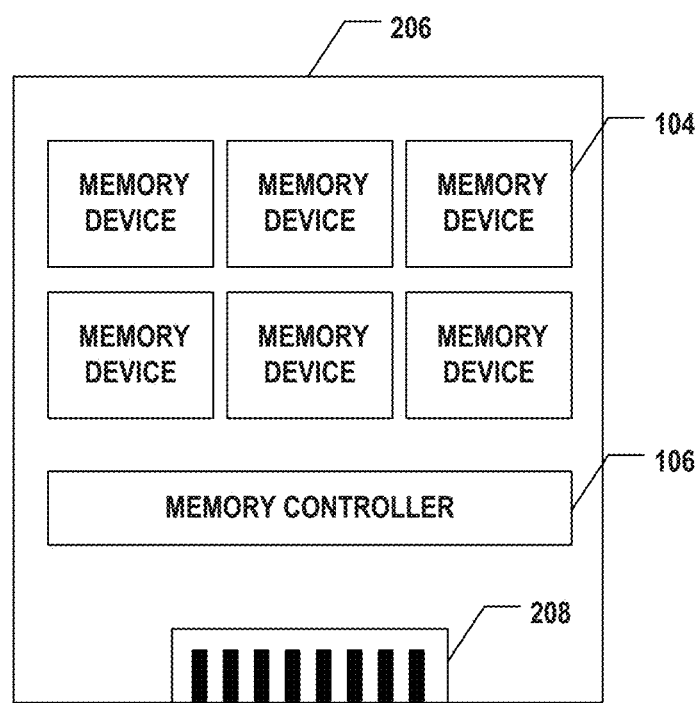
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
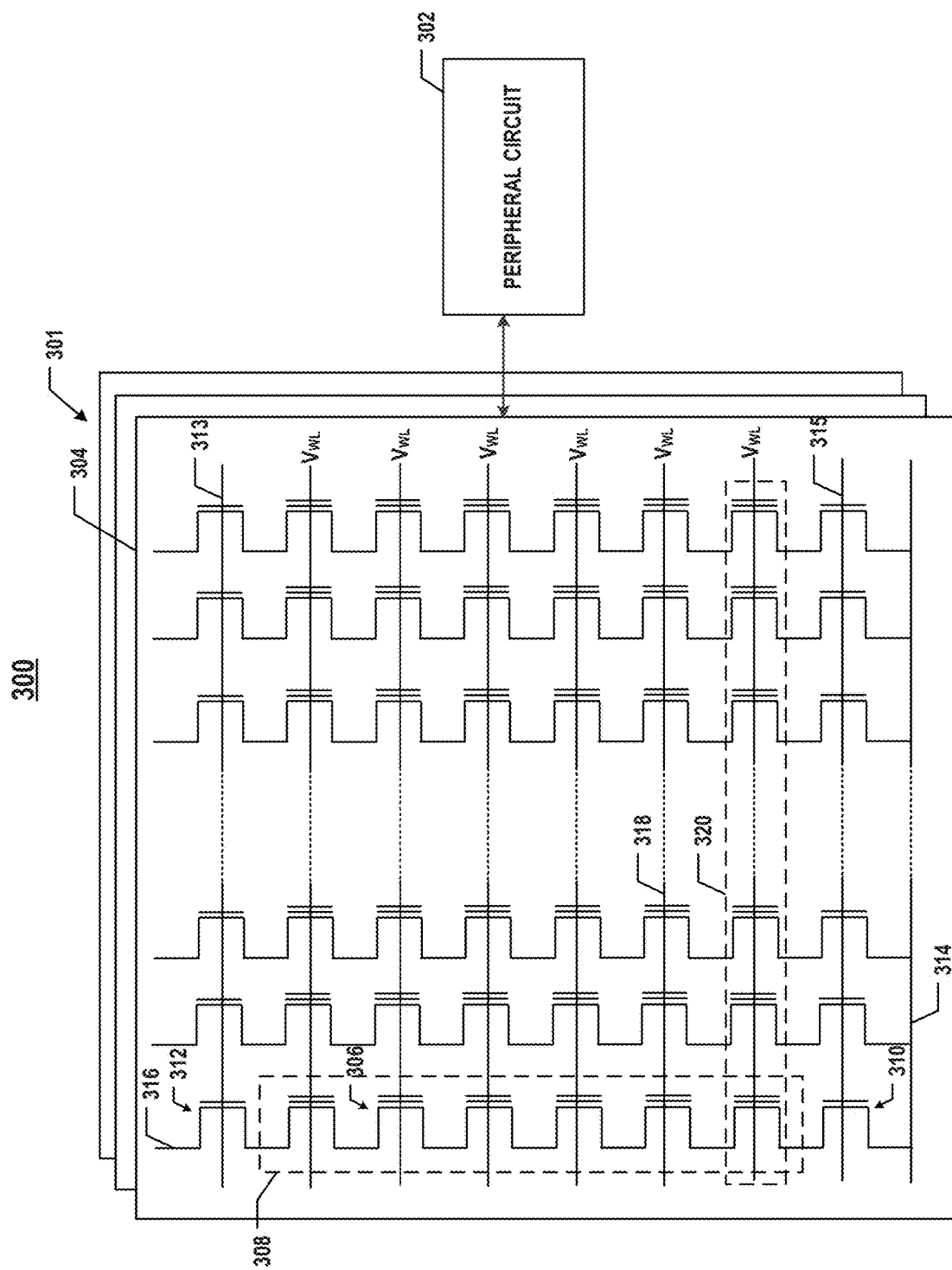
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single level cell (SLC) that has two possible memory states (levels) and thus, can store one bit of data. For example, the first memory state "0" can correspond to a first range of threshold voltages, and the second memory state "1" can correspond to a second range of threshold voltages. In some implementations, each memory cell 306 is an xLC that is capable of storing more than a single bit of data in more than four memory states (levels). For example, the xLC may store two bits per cell (MLC), three bits per cell (TLC), or four bits per cell (QLC)). Each xLC can be programmed to assume a range of possible nominal storage values (i.e., $2^N$ pieces of N-bits data, e.g., gray codes). In one example, the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive bias voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for read and program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
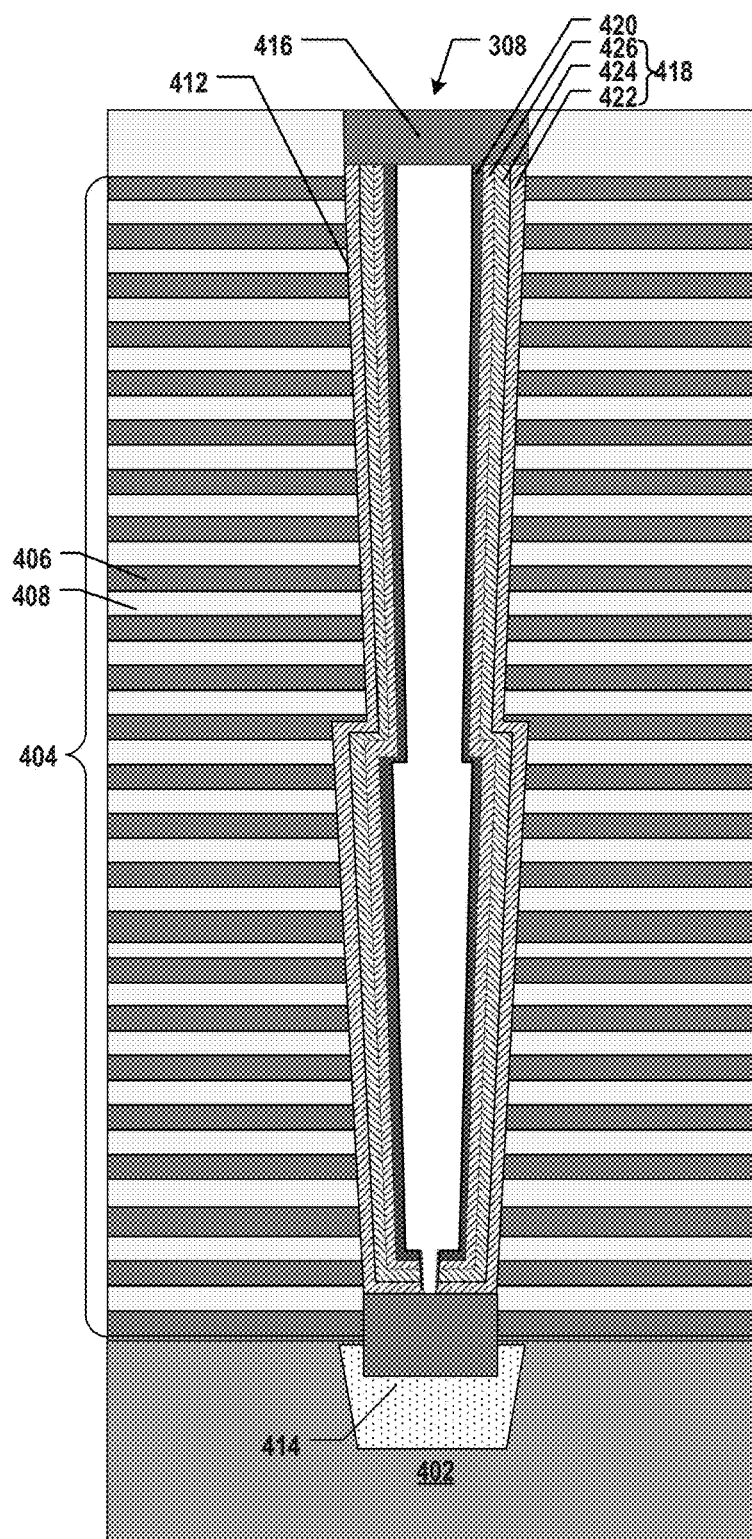
FIG. 4 illustrates a side view of a cross-section of an exemplary memory cell array including a NAND memory string, according to some aspects of the present disclosure.

FIG. 4 illustrates a side view of a cross-section of exemplary memory cell array 301 including NAND memory string 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308. It is understood that although not shown in FIG. 4, additional components of memory cell array 301 can be formed including, but not limited to, gate line slits/source contacts, local contacts, interconnect layers, etc.

Figure 5:
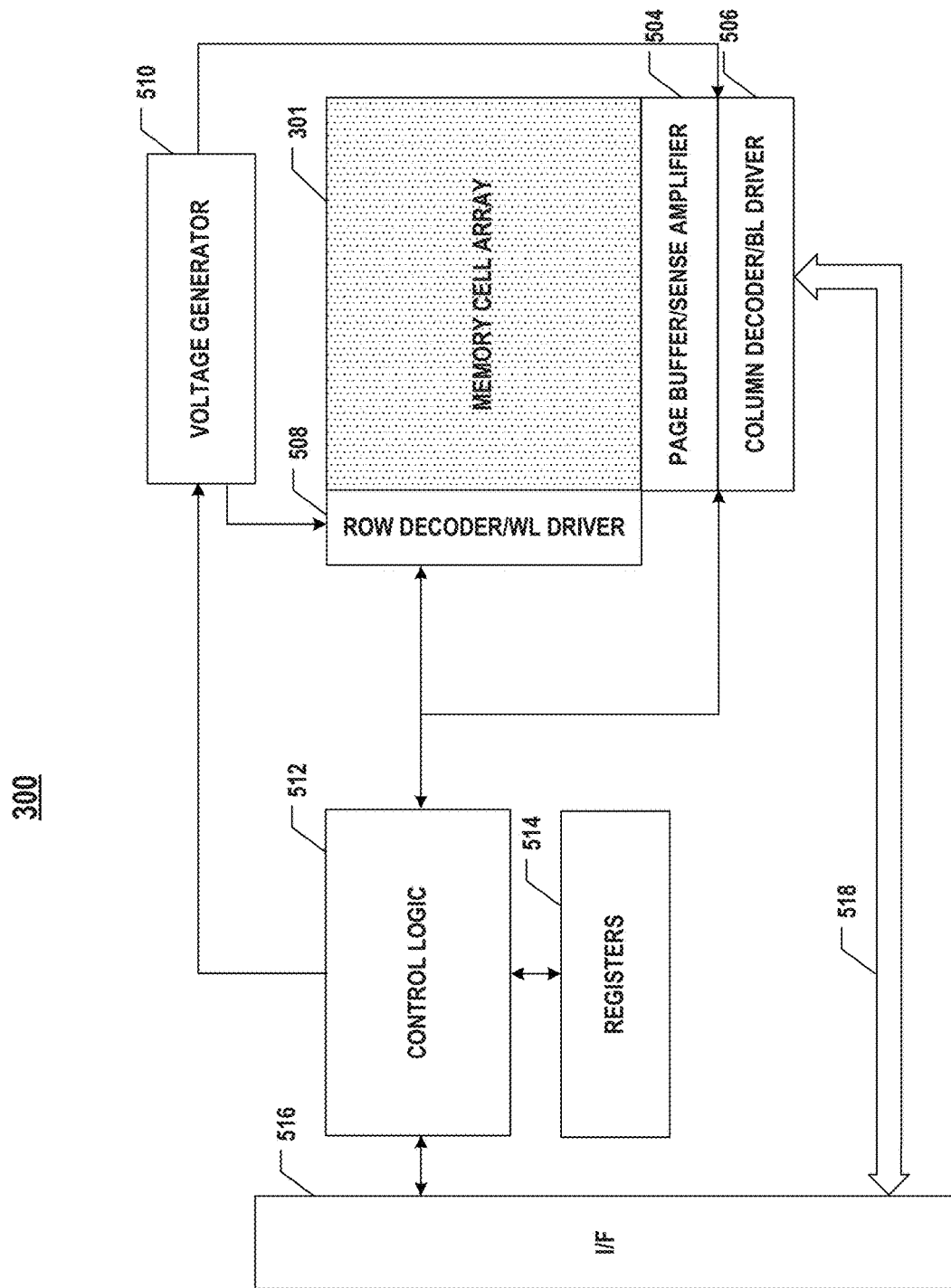
FIG. 5 illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may verify programmed target memory cells 306 in each program/verify loop (cycle) in a program operation to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. As described below in detail and consistent with the scope of the present disclosure, in program operations, page buffer/sense amplifier 504 can include storage modules (e.g., latches, caches, registers, etc.) for temporarily storing a piece of N-bits data (e.g., in the form of gray codes) received from data bus 518 and providing the piece of N-bits data to a corresponding target memory cell 306 through the corresponding bit line 316 in each program pass of a multi-pass program operation using a $2^N$-$2^N$ scheme.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (e.g., 108 in FIG. 1) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 301.

Figure 6:
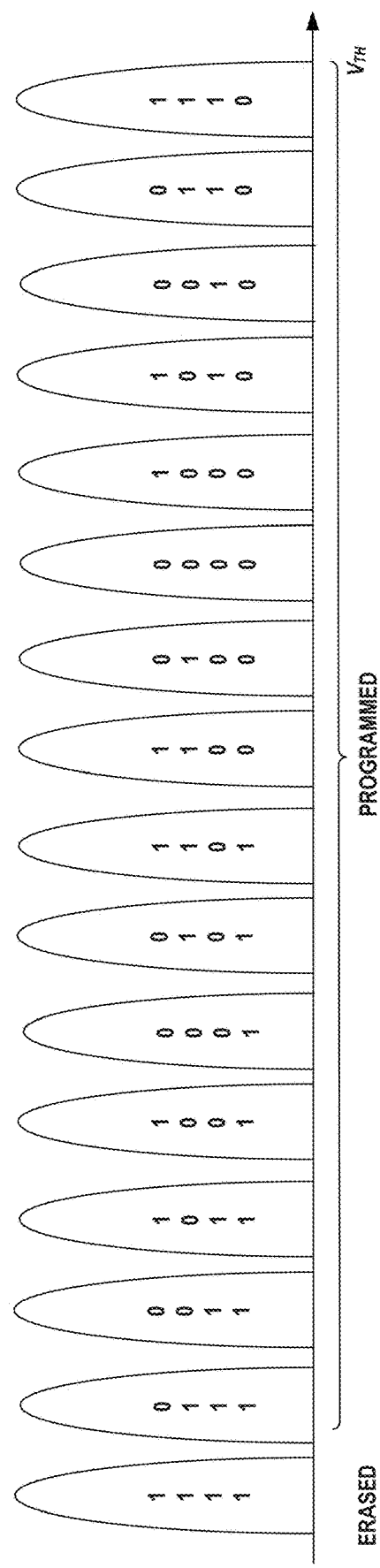
FIG. 6 illustrates exemplary threshold voltage distributions of memory cells in a program operation, according to some aspects of the present disclosure.

FIG. 6 illustrates exemplary threshold voltage distributions of memory cells in a program operation, according to some aspects of the present disclosure. As described above, each memory cell 306 can be configured to store a piece of N-bits data in one of $2^N$ levels, where N is an integer greater than 1 (e.g., N=2 for MLCs, N=3 for TLCs, N=4 for QLCs, etc.). Each level can correspond to one of $2^N$ threshold voltage (Vth) ranges of memory cells 306. Considering a multi-pass program operation in which memory cell 306 may be programmed into an intermediate level first in a coarse program pass, the "level" referred to herein may be considered as the final level after the fine program pass of the multi-pass program operations, in contrast to the intermediate level. Taking QLCs, where N=4, for example, as shown in FIG. 6, memory cell 306 may be programmed into one of the 16 levels, including one level of the erased state and 15 levels of the programmed states. Each level may correspond to a respective threshold voltage (Vth) range of memory cells 306. For example, the level corresponding to the lowest threshold voltage range (the left-most threshold voltage distribution in FIG. 6) may be considered as level 0, the level corresponding to the second-lowest threshold voltage range (the second left-most threshold voltage distribution in FIG. 6) may be considered as level 1, and so until level 15 corresponding to the highest threshold voltage range (the right-most threshold voltage distribution in FIG. 6).

On the other hand, each level can correspond to one of the $2^N$ pieces of N-bits data that is to be stored in target memory cell 306. In some implementations, the $2^N$ pieces of N-bits data may be represented by (in the form of) a gray code. A gray code (a.k.a., reflected binary code (RBC) or reflected binary (RB)) is an ordering of the binary numeral system such that two successive values differ in only one bit (binary digit). For example, TABLE 1 below shows an example of a binary code representing a one-to-one mapping between 16 levels (Lvl 0 to Lvl 15) and 16 pieces of 4-bits data used in the example of FIG. 6. As shown in TABLE 1, each piece of 4-bits data may consist of four bits of binary values (b1, b2, b3, and b4). In one example, level 1 may correspond to a piece of 4-bits data having a value of 1111. In another example, level 15 may correspond to another piece of 4-bits data having a value of 1110.

TABLE 1

| Lvl | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| b1 | 1 | 0 | 0 | 0 | 1 | 1 | 0 | 0 | 0 | 0 | 0 | 1 | 1 | 1 | 1 | 1 |
| b2 | 1 | 1 | 1 | 0 | 0 | 0 | 0 | 1 | 1 | 0 | 0 | 0 | 0 | 1 | 1 | 1 |
| b3 | 1 | 1 | 1 | 1 | 1 | 0 | 0 | 0 | 0 | 0 | 1 | 1 | 0 | 0 | 0 | 1 |
| b4 | 1 | 1 | 0 | 0 | 0 | 0 | 0 | 0 | 1 | 1 | 1 | 1 | 1 | 1 | 0 | 0 |

Figure 7:
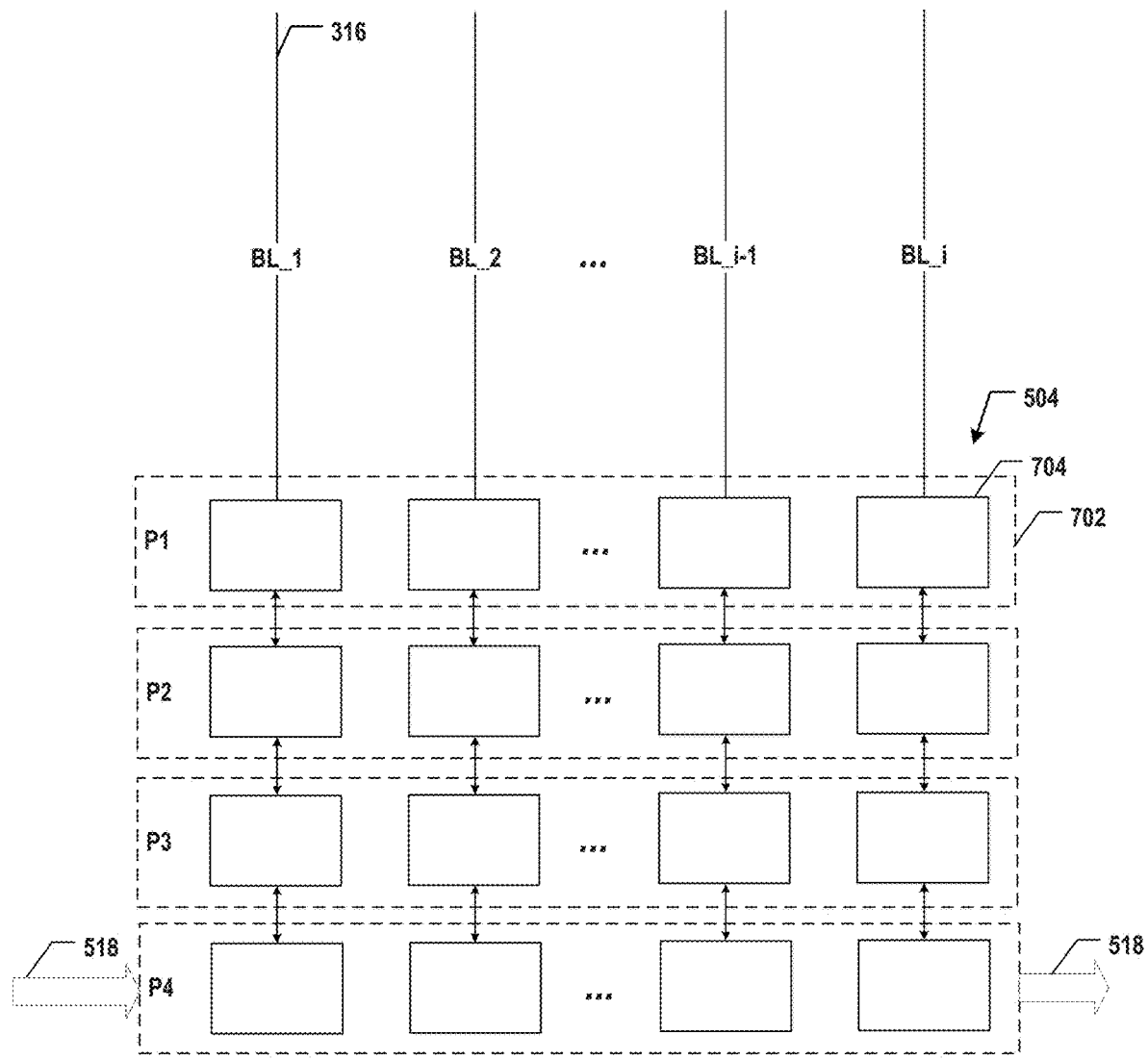
FIG. 7 illustrates a block diagram of an exemplary page buffer in a program operation, according to some aspects of the present disclosure.

Also referring to FIG. 5, in a program operation, N pages of the N-bits data transmitted through data bus 518 can be temporarily stored in page buffer/sense amplifier 504, and page buffer/sense amplifier 504 can be configured to provide to each target memory cell 306 the corresponding piece of N-bits data through the corresponding bit line 316. For example, FIG. 7 illustrates a block diagram of exemplary page buffer/sense amplifier 504 in a program operation, according to some aspects of the present disclosure. In some implementations, page buffer/sense amplifier 504 includes N storage modules (e.g., latches and/or caches) each configured to temporarily store one of N pages of data. That is, the N-bits data (having $2^N$ values) to be stored by a page 320 of target memory cells 306 coupled to a selected word line 318 can be transmitted, stored, and provided in the form of N pages of N-bits data in a program operation.

Still taking QLCs, where N=4, for example, as shown in FIG. 7, page buffer/sense amplifier 504 may include 4 storage modules 702 (P1, P2, P3, and P4) each configured to temporarily store one of 4 pages of 4-bits data. Each storage module 702 may include i storage units 704 (e.g., registers) corresponding to i target memory cells 306 in a page 320 of memory cells 306 coupled to a selected word line 318 in a program operation. That is, each target memory cell 306 may be coupled to a corresponding set of four storage units 704 from each of four storage modules 702 (P1, P2, P3, and P4) through a respective bit line 316 (BL_1, BL_2, . . . , BL_i−1, or BL_i). For each target memory cell 306 in a program operation, the four bits of binary values in the corresponding piece of 4-bits data (e.g., b1, b2, b3, and b4 according to the gray code in TABLE 1) may be temporarily stored the corresponding set of four storage units 704, respectively, such that the corresponding piece of 4-bits data may be provided to target memory cell 306 by page buffer/sense amplifier 504.

In a multi-pass program operation, in the fine program pass (e.g., the last program pass that programs each target memory cell 306 into a final level), each target memory cell 306 can be programmed into one of the $2^N$ levels based on the corresponding N bits of data to be stored in target memory cell 306. As to the coarse program pass (e.g., any non-last program pass that programs each target memory cell into an intermediate level), each target memory cell 306 is programmed into one of the $2^n$ levels (where n<N) based on the corresponding n bits of data to be stored in target memory cell 306, according to some implementations. For example, for the 8-16 scheme described above, in the coarse program pass, each target memory cell 306 may be programmed into 8 levels (where n=3<4), as opposed to 16 levels, based on 3 of the 4 bits of data to be stored in target memory cell 306. In other words, for the 8-16 scheme or any $2^n$-$2^N$ scheme, only some (n) pages of the N pages of N-bits data may be used to program target memory cells 306 in the coarse program pass (e.g., the non-last program pass).

In contrast, as described herein with respect to the $2^N$-$2^N$ schemes, in the coarse program pass (e.g., a non-last program pass), each target memory cell 306 is programmed into one of the $2^N$ levels based on the corresponding N bits of data to be stored in target memory cell 306, according to some implementations. For example, for the 16-16 scheme described above, in the coarse program pass, each target memory cell 306 may be programmed into 16 levels (where N=4), as opposed to 8 levels, based on all of the 4 bits of data to be stored in target memory cell 306. In other words, for the 16-16 scheme or any $2^N$-$2^N$ scheme, all pages of the N pages of N-bits data may be used to program target memory cells 306 in the coarse program pass (e.g., the non-last program pass). Compared with the $2^n$-$2^N$ schemes, the read margin can be enlarged, and the read time can be reduced for the $2^N$-$2^N$ schemes.

Figure 8A:
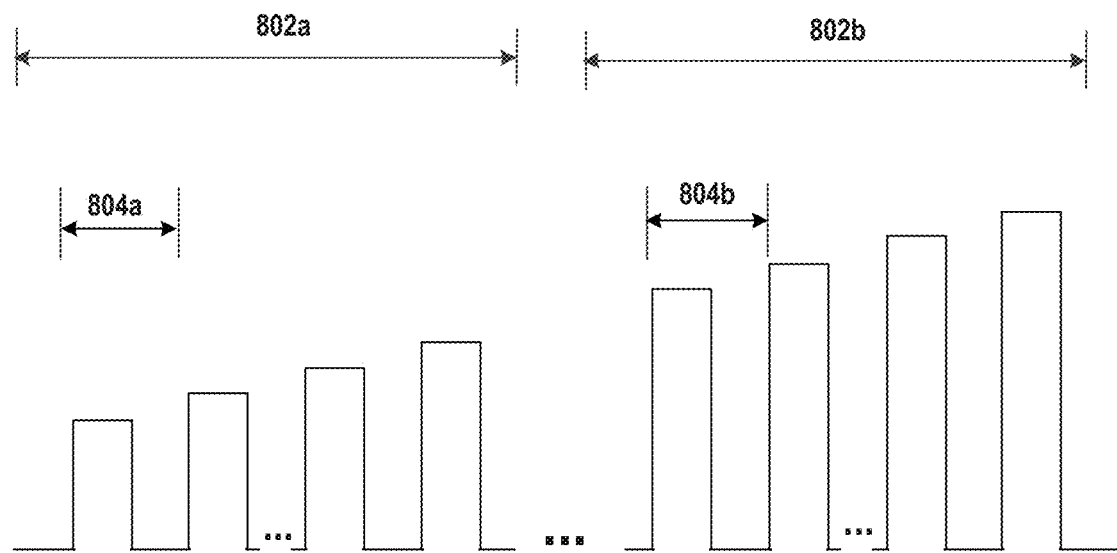
FIGS. 8A and 8B illustrate a waveform of word line voltages applied to a selected word line in a multi-pass program operation.
Figure 8B:
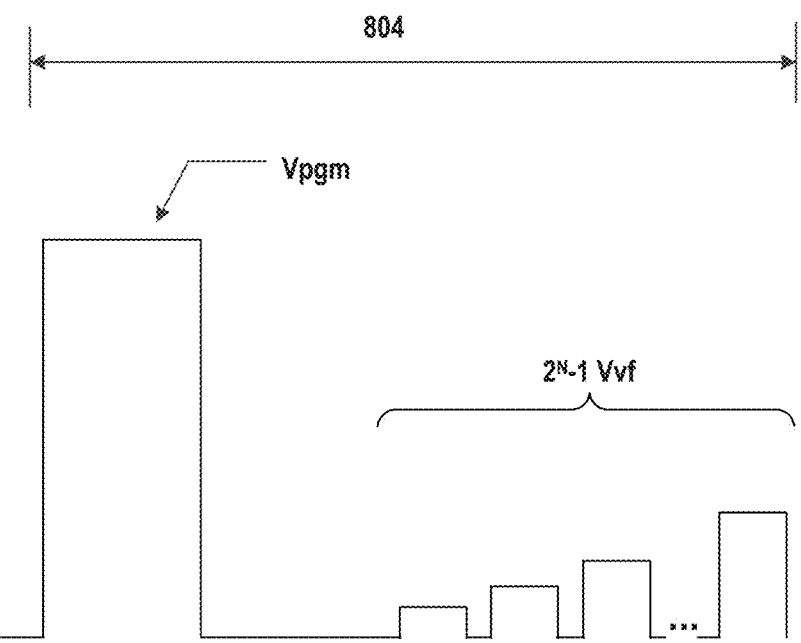

To perform a program operation, in addition to page buffer/sense amplifier 504 providing to each target memory cell 306 the corresponding piece of N-bits data, row decoder/word line driver 508 can be configured to apply program voltages and verify voltages to a selected word line 318 coupled to a row of target memory cells 306 in one or more program/verify loops in order to raise the threshold voltage of each target memory cell 306 to a desired level (into a desired range of threshold voltages) based on the corresponding piece of N-bits data. For example, FIGS. 8A and 8B illustrate a waveform of word line voltages applied to a selected word line in a multi-pass program operation. As shown in FIG. 8A, the multi-pass program operation includes at least a first pass 802a (a.k.a., a coarse program pass, e.g., a non-last program pass) and a second pass 802b (a.k.a., a fine program pass, e.g., the last program pass) after first pass 802a. First pass 802a includes one or more program/verify loops 804a, and second pass 802b includes one or more program/verify loops 804b as well.

As shown in FIG. 8B, in each program/verify loop 804, regardless of whether it is in first pass 802a or second pass 802b, a program voltage (Vpgm) is applied to the selected word line, followed by a number of verify voltages (Vvf) with incremental changes of voltage levels. For $2^N$-$2^N$ schemes, the number of verify voltages in each program/verify loop 804 in first pass 802a is the same as that in second pass 802b, i.e., $2^N-1$, in order to verify all $2^N$ possible intermediate levels corresponding to 2 possible values of the N-bits data. Still taking QLCs, where N=4, for example, as shown in FIG. 9, the target memory cells are first programmed into one of 16 intermediate levels in first pass 802a by applying 15 verify voltages each between two adjacent intermediate levels. In second pass 802b, by applying a larger program voltage, the threshold voltages of target memory cells in each level (e.g., in the programmed state) are shifted up to a respective final level with reduced width of the threshold voltage distribution (i.e., a narrower range). The numbers of verify voltages (and corresponding verify processes) in each program/verify loop 804 in each of first and second passes 802a and 802b are the same, i.e., 15. In contrast, for $2^n$-$2^N$ schemes, the number of verify voltages in each program/verify loop 804 in first pass 802a is smaller than that in second pass 802b, i.e., $2^n-1$, in order to verify only $2^n$ possible intermediate levels corresponding to n bits of the N-bits data. Thus, the $2^N$-$2^N$ schemes have a longer program time and slower program speed than the $2^n$-$2^N$ schemes due to the increased number of verify voltages in first pass 802a.

To take advantages of both the large read margin and short read time of the $2^N$-$2^N$ schemes and the fast program speed of the $2^n$-$2^N$ schemes, consistent with the scope of the present disclosure, in a multi-pass program operation, target memory cells to be programmed with different pieces of data (e.g., with different values of gray code) are grouped and verified using the same verify voltage at the same time, as opposed to using multiple verify voltages at different times, according to some implementations. As a result, multiple intermediate levels in the coarse program pass can be grouped and merged into one intermediate level, thereby reducing the verify duration and increasing the program speed, compared with the known $2^N$-$2^N$ schemes. On the other hand, each target memory cells can still be programmed based on one of the $2^N$ pieces of N-bits data (e.g., 16 values of gray code for QLC where N=4), as opposed to a subset (n of N) thereof (e.g., 8 values of 3-bits data for QLC where n=3), thereby still enjoying the benefit of large read margin and short read time of the $2^N$-$2^N$ schemes, compared with the known $2^n$-$2^N$ schemes.

Referring to FIGS. 3-5, each memory cell 306 is configured to store a piece of N-bits data in one of the $2^N$ levels (final levels), where N is an integer greater than 1, according to some implementations. The level can correspond to one of the $2^N$ pieces of N-bits data, such as one value of $2^N$ values of an N-bits gray code. To perform a multi-pass program operation, peripheral circuit 302 can be configured to program, in a first pass (a.k.a., a coarse program pass, e.g., a non-last program pass), a row of target memory cells 306 coupled to a selected word line 318, such that each target memory cell 306 is programmed into one of the $2^N/m$ intermediate levels based on the piece of N-bits data to be stored in target memory cell 306, where m is an integer greater than 1 (e.g., 2, 3, 4, 5, etc.). That is, each m intermediate levels of the known $2^N$-$2^N$ schemes can be grouped into one intermediate level of the scheme disclosed herein. In some implementations, them intermediate levels are adjacent intermediate levels. The intermediate level can correspond to one of the $2^N/m$ intermediate threshold voltage ranges of target memory cells 306, and each of the $2^N/m$ intermediate levels can correspond to m of the $2^N$ pieces of N-bits data. That is, the number of intermediate levels (and corresponding intermediate threshold voltage ranges can be reduced to a fraction of m. In some implementations, target memory cells 306 corresponding to m different values of the gray code are programmed into a same intermediate level, as supposed to m different intermediate levels, in the coarse program pass. In one example, target memory cells 306 to store the values of 1111 and 0111 in TABLE 1 may be programmed to a same intermediate level, instead of to two different intermediate levels, in the coarse program pass. In another example, target memory cells 306 to store the values of 1001, 1101, 1100, and 1110 in TABLE 1 may be programmed to a same intermediate level, instead of to four different intermediate levels, in the coarse program pass.

Figure 11:
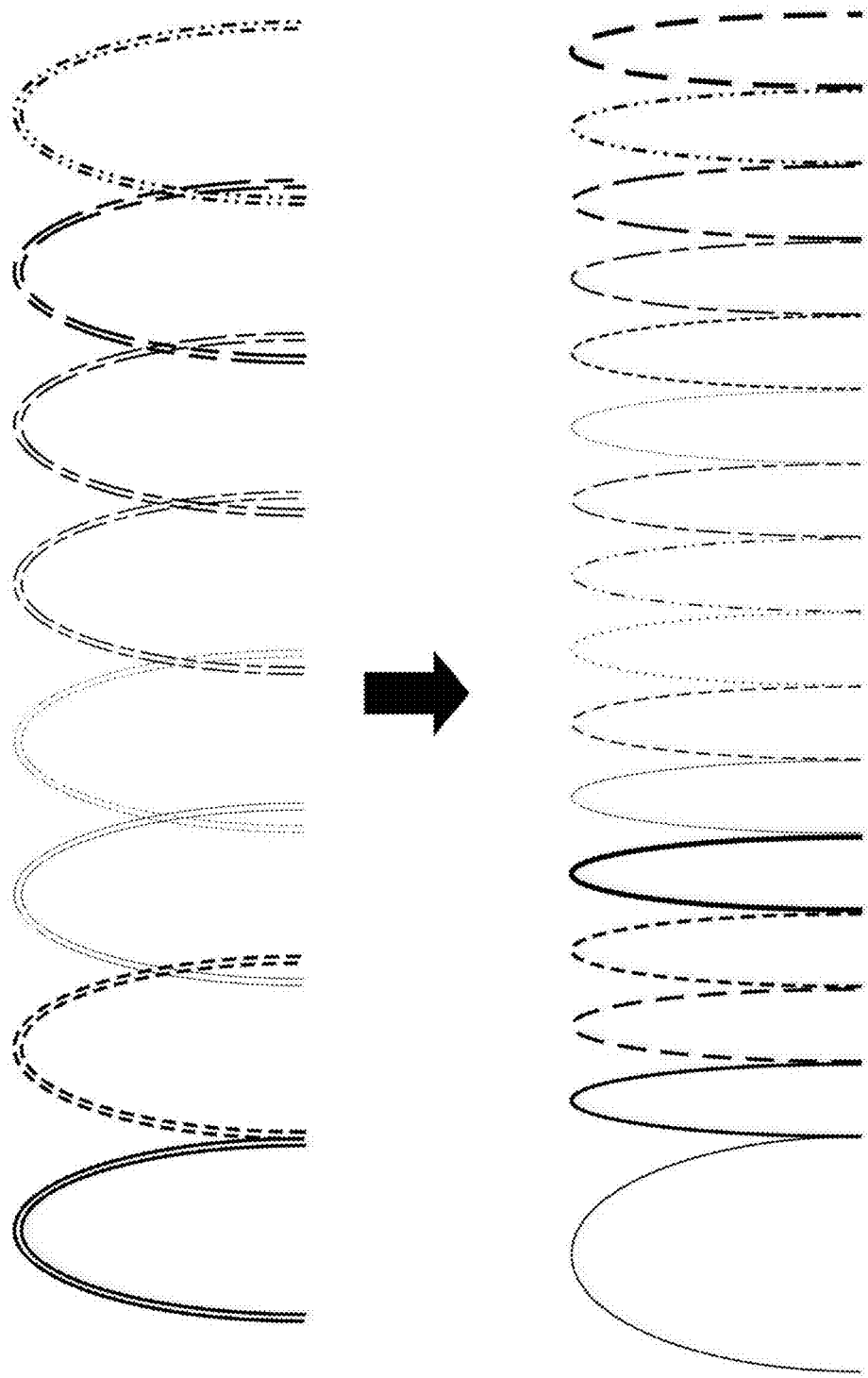
FIG. 11 illustrates exemplary threshold voltage distributions of memory cells in a multi-pass program operation, according to some aspects of the present disclosure.

Different from the known $2^n$-$2^N$ schemes in which the reduction of the number of intermediate levels comes from the reduction of the total values of data (and the bit number) used in the coarse program pass (e.g., from N to n), the total values of data (and the bit number) used in the coarse program pass of the scheme disclosed herein remain the same (N), while the mapping relationship between the intermediate levels and the $2^N$ pieces of N-bits data changes from one-to-one to one-to-m. Still taking QLCs, where N=4 for example, as shown in FIG. 11 and TABLE 2 below, two (m=2) intermediate levels may be grouped into one intermediate level, i.e., having the same intermediate level (Int Lvl) (the same intermediate threshold voltage range), such that target memory cells 306 may be first programmed into one of 8 intermediate levels (Int Lvl 0 to 7). As shown in TABLE 2, each intermediate level may correspond to two different values of a 4-bit gray code, as opposed to only one value of a 4-bit gray code according to the known 16-16 scheme. Also different from the known 8-16 scheme in which the 8 intermediate levels each corresponds to one value of a 3-bit gray code, as shown in TABLE 2, each of the 8 intermediate levels may correspond to two values of a 4-bit gray code.

TABLE 2

| Int Lvl | 0 | | 1 | | 2 | | 3 | | 4 | | 5 | | 6 | | 7 | |
|---|---|---|---|---|---|---|---|---|---|---|---|---|---|---|---|---|
| b1 | 1 | 0 | 0 | 0 | 1 | 1 | 0 | 0 | 0 | 0 | 0 | 1 | 1 | 1 | 1 | 1 |
| b2 | 1 | 1 | 1 | 0 | 0 | 0 | 0 | 1 | 1 | 0 | 0 | 0 | 0 | 1 | 1 | 1 |
| b3 | 1 | 1 | 1 | 1 | 1 | 0 | 0 | 0 | 0 | 0 | 1 | 1 | 0 | 0 | 0 | 1 |
| b4 | 1 | 1 | 0 | 0 | 0 | 0 | 0 | 0 | 1 | 1 | 1 | 1 | 1 | 1 | 0 | 0 |

FIG. 10 illustrates an exemplary waveform of word line voltages applied to a selected word line in a multi-pass program operation, according to some aspects of the present disclosure. Also referring to FIGS. 3-5, in some implementations, to program the row of target memory cells 306 in a first pass 1001, row decoder/word line driver 508 is configured to apply a first program voltage Vpgm 1 to a selected word line 318 in each program/verify loop 1002. It is understood that first pass 1001 may include one or more program/verify loops 1002 having different first program voltages Vpgm 1, for example, using the incremental step pulse programming (ISPP) scheme. For ease of description, only one program/verify loop 1002 is illustrated in FIG. 10. To program the row of target memory cells 306 in first pass 1001, page buffer/sense amplifier 504 is configured to provide to each target memory cell 306 the corresponding piece of N-bits data (e.g., one value of $2^N$ values of an N-bits gray code), according to some implementations. For example, when N=4, as shown in FIG. 7, for each QLC under coarse programming, page buffer/sense amplifier 504 may provide a corresponding piece of 4-bits data (e.g., a 4-bit gray code b1b2b3b4 in TABLE 2) from the respective set of 4 storage units 704 in each of 4 storage modules 702.

In some implementations, to program the row of target memory cells 306 in first pass 1001, row decoder/word line driver 508 is configured to verify the row of target memory cells 306 using $(2^N/m)-1$ verify voltages based on the $2^N/m$ intermediate levels. To verify target memory cells 306 in $2^N/m$ intermediate levels, $(2^N/m)-1$ verify voltages can be used. For example, 7 verify voltages may be used to verify target memory cells 306 in 8 intermediate levels (N=4, and m=2). By grouping m intermediate levels into one intermediate level, e.g., by changing the one-to-one mapping to the one-to-m mapping between the intermediate levels and the values of a gray code, the number of verify voltages (and the number of verify processes) in each program/verify loop 1002 in first pass 1001 can be reduced from $2^N-1$ (e.g., in FIG. 8B) to $(2^N/m)-1$ (e.g., in FIG. 10).

As shown in FIG. 10, to verify the row of target memory cells 306, row decoder/word line driver 508 can be configured to sequentially apply the $(2^N/m)-1$ verify voltages (Vvf) to selected word line 318. In some implementations, each of the $(2^N/m)-1$ verify voltages is between two adjacent intermediate levels of the $2^N/m$ intermediate levels. For example, when N=4, as shown in FIG. 11, for each QLC undergoing coarse programming, only 7 verify voltages each between two adjacent intermediate levels may be needed to verify target memory cells 306 in one of 8 intermediate levels. Target memory cells 306 corresponding to the m pieces of N-bits data (e.g., corresponding to different values of the gray code but in the same intermediate level) can be verified under the same condition or under different conditions. The conditions can include, for example, the specific program/verify loop of multiple program/verify loops 1002 in first pass 1001 and the condition to determine whether the verification is passed (e.g., the fail bit count specification). In one example, target memory cells 306 corresponding to different values of the gray code but in the same intermediate level may be verified in the same program/verify loop 1002 or may be verified starting in different program/verify loops 1002. In another example, target memory cells 306 corresponding to different values of the gray code but in the same intermediate level may have the same or different fail bit count specifications to determine whether the verification is passed (and thus stop programming those target memory cells 306 in first pass 1001). In still another example, target memory cells 306 corresponding to different values of the gray code but in the same intermediate level may be formed to finish the verification (and thus the coarse programming of those target memory cells 306) in the same program/verify loop 1002 or different program/verify loops 1002 determined under any suitable conditions.

To perform the multi-pass program operation, peripheral circuit 302 can be further configured to program, in a second pass (a.k.a., a fine program pass, e.g., the last program pass), the row of target memory cells 306, such that each target memory cell 306 is programmed into one of the $2^N$ levels (final levels) based on the piece of N-bits data to be stored in target memory cell 306. The level (final level) can correspond to one of $2^N$ threshold voltage ranges (final threshold voltage ranges) of target memory cells 306, and the final threshold voltage range can be higher than the intermediate threshold voltage range. That is, the threshold voltage range of target memory cells 306 in a same intermediate level can be shifted up and split into m different final threshold voltage ranges by the second pass. The m pieces of N-bits data corresponding to the same intermediate level in the first pass can correspond to m final levels of the $2^N$ final levels in the second pass. In some implementations, the m final levels are adjacent levels of the $2^N$ final levels. Still taking QLCs, where N=4, for example, as shown in FIG. 11, the threshold voltage range of target memory cells 306 in a same intermediate level may be shifted up and split into two adjacent final threshold voltage ranges (two adjacent final levels) by the fine program pass, such that the number of levels may be increased from 8 intermediate levels to 16 final levels. It is understood that the final level in the erased state may be the same as the corresponding intermediate level.

In some implementations, to program the row of target memory cells 306 in a second pass 1003, row decoder/word line driver 508 is configured to apply a second program voltage Vpgm 2 to selected word line 318 in each program/verify loop 1004. It is understood that second pass 1003 may also include one or more program/verify loops 1004 having different second program voltages Vpgm 2, for example, using the ISPP scheme as well. For ease of description, only one program/verify loop 1004 is illustrated in FIG. 10. The second program voltage Vpgm 2 can be higher than the first program voltage Vpgm 1 in order to shift the threshold voltage distributions up as described above. To program the row of target memory cells 306 in second pass 1003, page buffer/sense amplifier 504 is configured to provide to each target memory cell 306 the corresponding piece of N-bits data (e.g., one value of $2^N$ values of an N-bits gray code), according to some implementations. For example, when N=4, as shown in FIG. 7, for each QLC under coarse programming, page buffer/sense amplifier 504 may provide a corresponding piece of 4-bits data (e.g., a 4-bit gray code b1b2b3b4 in TABLE 2) from the respective set of 4 storage units 704 in each of 4 storage modules 702.

In some implementations, to program the row of target memory cells 306 in second pass 1003, row decoder/word line driver 508 is configured to verify the row of target memory cells 306 using $2^N-1$ verify voltages based on the $2^N$ levels (final levels). To verify target memory cells 306 in $2^N$ final levels, $2^N-1$ verify voltages can be used. For example, 15 verify voltages may be used to verify target memory cells 306 in 16 final levels (N=4). As shown in FIG. 10, to verify the row of target memory cells 306, row decoder/word line driver 508 can be configured to sequentially apply the $2^N-1$ verify voltages (Vvf) to selected word line 318. In some implementations, each of the $2^N-1$ verify voltages is between two adjacent final levels of the $2^N$ final levels. For example, when N=4, as shown in FIG. 11, for each QLC undergoing fine programming, 15 verify voltages each between two adjacent final levels may be needed to verify target memory cells 306 in one of 16 final levels.

Figure 12:
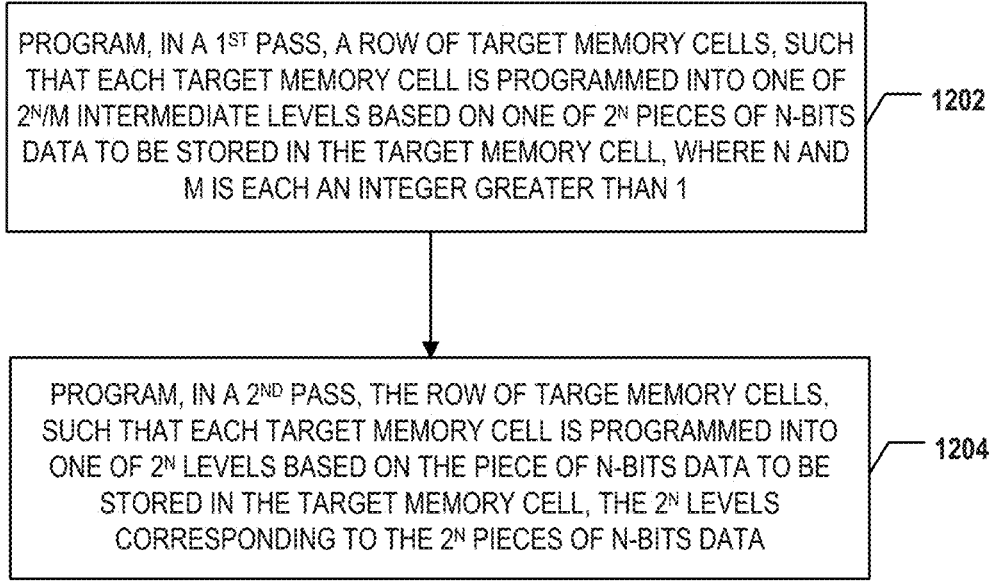
FIG. 12 illustrates a flowchart of an exemplary method for operating a memory device, according to some aspects of the present disclosure.

FIG. 12 illustrates a flowchart of a method 1200 for operating a memory device, according to some aspects of the present disclosure. The memory device may be any suitable memory device disclosed herein, such as memory device 300. Method 1200 may be implemented by peripheral circuit 302, such as row decoder/word line driver 508 and page buffer/sense amplifier 504. It is understood that the operations shown in method 1200 may not be exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which a row of target memory cells of the plurality of rows of memory cells are programmed in a first pass, such that each of the row of target memory cells is programmed into one of the $2^N/m$ intermediate levels based on one of $2^N$ pieces of N-bits data to be stored in the target memory cell, where N and m is each an integer greater than 1. The intermediate level can correspond to one of the $2^N/m$ intermediate threshold voltage ranges of the target memory cells. Each of the $2^N/m$ intermediate levels can correspond to m of the $2^N$ pieces of N-bits data. For example, in a coarse program pass of a multiple program operation, peripheral circuit 302 may program a row of QLCs, such that each QLC is programmed into one of 8 intermediate levels based on one of 16 pieces of 4-bits data to be stored in the QLC (where N=4, and m=2).

Figure 13:
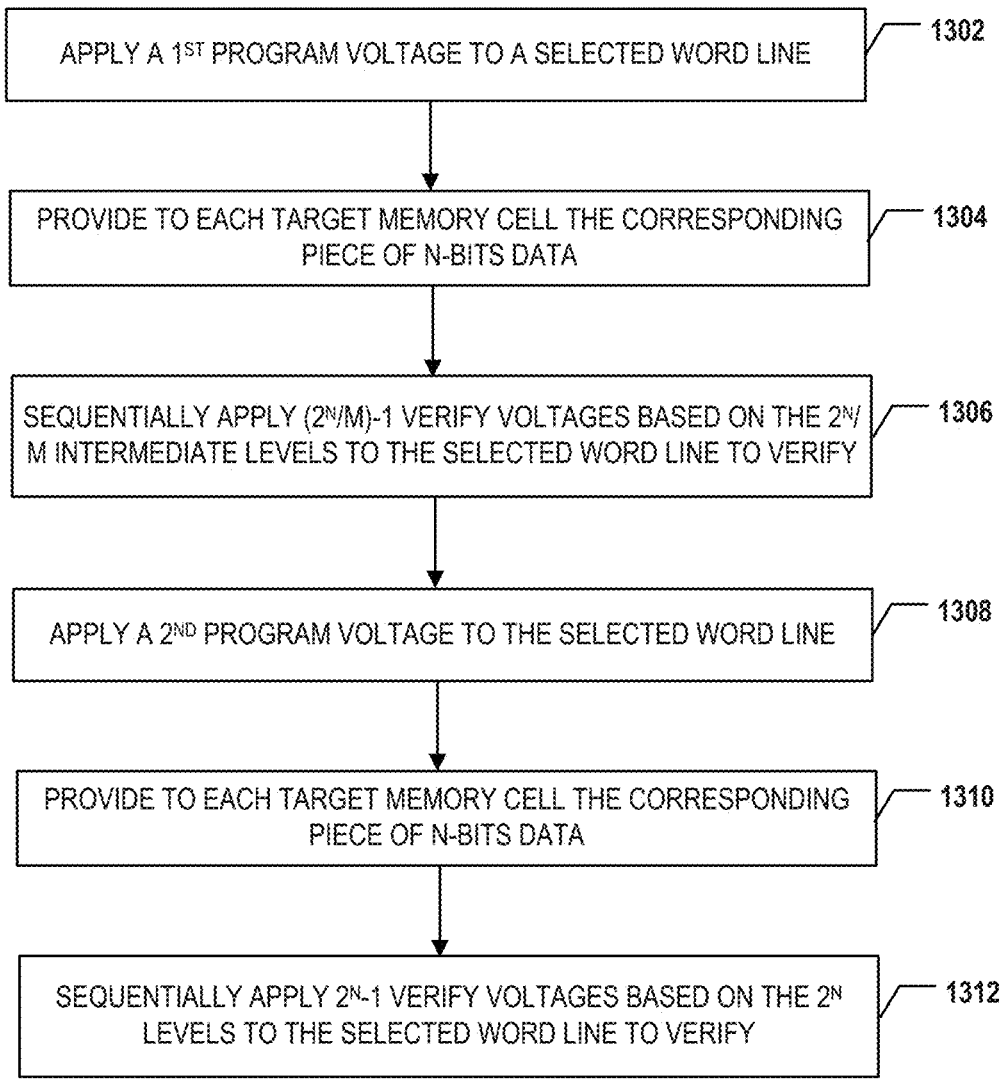
FIG. 13 illustrates a flowchart of another exemplary method for operating a memory device, according to some aspects of the present disclosure.

As shown in FIG. 13, at 1302, in some implementations, to program the row of memory cells in the first pass, a first program voltage is applied to a selected word line coupling the row of target memory cells. For example, in each program/verify loop in the coarse program pass, row decoder/word line driver 508 may apply a first program voltage Vpgm 1 to selected word line 318 coupled to the QLCs. At 1304, each target memory cell is provided with the corresponding piece of N-bits data. For example, in each program/verify loop in the coarse program pass, page buffer/sense amplifier 504 may provide a corresponding piece of 4-bits data to each QLC.

To program the row of memory cells in the first pass, the row of memory cells can be verified using $(2^N/m)-1$ verify voltages based on the $2^N/m$ intermediate levels. Target memory cells corresponding to m of the $2^N$ pieces of N-bits data can be verified using a same one of the $(2^N/m)-1$ verify voltages under the same or different conditions. As shown in FIG. 13, at 1306, in some implementations, to verify, the $(2^N/m)-1$ verify voltages are sequentially applied to the selected word line. Each of the $(2^N/m)-1$ verify voltages can be between two adjacent intermediate levels of the $2^N/m$ intermediate levels. For example, in each program/verify loop in the coarse program pass, row decoder/word line driver 508 may sequentially apply 7 verify voltages to selected word line 318 (where N=4, and m=2).

Method 1200 proceeds to operation 1204, as illustrated in FIG. 12, in which the row of target memory cells is programmed in a second pass after the first pass, such that each of the row of target memory cells is programmed into one of the $2^N$ levels based on the piece of N-bits data to be stored in the target memory cell. The $2^N$ levels can correspond to the $2^N$ pieces of N-bits data. The level can correspond to one of the $2^N$ threshold voltage ranges of target memory cells. The threshold voltage range can be higher than the intermediate threshold voltage range. The m pieces of N-bits data can correspond to m of the $2^N$ levels. The m levels can be adjacent levels of the $2^N$ levels.

As shown in FIG. 13, at 1308, in some implementations, to program the row of memory cells in the second pass, a second program voltage is applied to the selected word line. For example, in each program/verify loop in the fine program pass, row decoder/word line driver 508 may apply a second program voltage Vpgm 2 to selected word line 318 coupled to the QLCs. At 1310, each target memory cell is provided with the corresponding piece of N-bits data. For example, in each program/verify loop in the fine program pass, page buffer/sense amplifier 504 may provide a corresponding piece of 4-bits data to each QLC.

To program the row of memory cells in the second pass, the row of memory cells can be verified using $2^N-1$ verify voltages based on the $2^N$ intermediate levels. As shown in FIG. 13, at 1312, in some implementations, to verify, the $2^N-1$ verify voltages are sequentially applied to the selected word line. Each of the $2^N-1$ verify voltages can be between two adjacent final levels of the $2^N$ final levels. For example, in each program/verify loop in the fine program pass, row decoder/word line driver 508 may sequentially apply 15 verify voltages to selected word line 318 (where N=4).

According to one aspect of the present disclosure, a memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of the $2^N/m$ intermediate levels based on the piece of N-bits data to be stored in the target memory cell, where m is an integer greater than 1. The peripheral circuit is also configured to program, in a second pass after the first pass, the row of target memory cells, such that each of the row of target memory cells is programmed into one of the $2^N$ levels based on the piece of N-bits data to be stored in the target memory cell.

In some implementations, the intermediate level corresponds to one of $2^N/m$ intermediate threshold voltage ranges of the target memory cells, and the level corresponds to one of $2^N$ threshold voltage ranges of target memory cells. The threshold voltage range can be higher than the intermediate threshold voltage range.

In some implementations, each of the $2^N/m$ intermediate levels corresponds to m of the $2^N$ pieces of N-bits data, and the m pieces of N-bits data correspond to m of the $2^N$ levels.

In some implementations, the m levels are adjacent levels of the $2^N$ levels.

In some implementations, to program, in the first pass, the row of target memory cells, the peripheral circuit includes a word line driver configured to apply a first program voltage to a selected word line of the word lines, the selected word line being coupled to the row of target memory cells, and a page buffer configured to provide to each target memory cell the corresponding piece of N-bits data.

In some implementations, to program, in the first pass, the row of target memory cells, the peripheral circuit is further configured to verify the row of memory cells using $(2^N/m)-1$ verify voltages based on the $2^N/m$ intermediate levels.

In some implementations, to verify the row of memory cells, the peripheral circuit includes a word line driver configured to sequentially apply the $(2^N/m)-1$ verify voltages to a selected word line of the word lines, the selected word line being coupled to the row of target memory cells.

In some implementations, each of the $(2^N/m)-1$ verify voltages is between two adjacent intermediate levels of the $2^N/m$ intermediate levels.

In some implementations, to program, in the second pass, the row of target memory cells, the peripheral circuit is further configured to verify the row of memory cells using $2^N-1$ verify voltages based on the $2^N$ levels.

In some implementations, to verify the row of memory cells, the peripheral circuit is configured to verify target memory cells corresponding to m of the $2^N$ pieces of N-bits data using a same one of the $(2^N/m)-1$ verify voltages.

In some implementations, the target memory cells corresponding to the m pieces of N-bits data are verified under different conditions.

According to another aspect of the present disclosure, a system includes a memory device configured to store data and a memory controller coupled to the memory device and configured to control the memory device. The memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of $2^N/m$ intermediate levels based on the piece of N-bits data to be stored in the target memory cell, where m is an integer greater than 1. The peripheral circuit is also configured to program, in a second pass after the first pass, the row of target memory cells, such that each of the row of target memory cells is programmed into one of the $2^N$ levels based on the piece of N-bits data to be stored in the target memory cell.

In some implementations, the intermediate level corresponds to one of $2^N/m$ intermediate threshold voltage ranges of the target memory cells, and the level corresponds to one of $2^N$ threshold voltage ranges of target memory cells. The threshold voltage range can be higher than the intermediate threshold voltage range.

In some implementations, each of the $2^N/m$ intermediate levels corresponds to m of the $2^N$ pieces of N-bits data, and the m pieces of N-bits data correspond to m of the $2^N$ levels.

In some implementations, the m levels are adjacent levels of the $2^N$ levels.

In some implementations, to program, in the first pass, the row of target memory cells, the peripheral circuit includes a word line driver configured to apply a first program voltage to a selected word line of the word lines, the selected word line being coupled to the row of target memory cells, and a page buffer configured to provide to each target memory cell the corresponding piece of N-bits data.

In some implementations, to program, in the first pass, the row of target memory cells, the peripheral circuit is further configured to verify the row of memory cells using $(2^N/m)-1$ verify voltages based on the $2^N/m$ intermediate levels.

In some implementations, to verify the row of memory cells, the peripheral circuit includes a word line driver configured to sequentially apply the $(2^N/m)-1$ verify voltages to a selected word line of the word lines, the selected word line being coupled to the row of target memory cells.

In some implementations, each of the $(2^N/m)-1$ verify voltages is between two adjacent intermediate levels of the $2^N/m$ intermediate levels.

In some implementations, to program, in the second pass, the row of target memory cells, the peripheral circuit is further configured to verify the row of memory cells using $2^N-1$ verify voltages based on the $2^N$ levels.

In some implementations, to verify the row of memory cells, the peripheral circuit is configured to verify target memory cells corresponding to m of the $2^N$ pieces of N-bits data using a same one of the $(2^N/m)-1$ verify voltages.

In some implementations, the target memory cells corresponding to the m pieces of N-bits data are verified under different conditions.

In some implementations, the system further includes a host coupled to the memory controller and configured to send or receive the data.

According to still another aspect of the present disclosure, a method for operating a memory device is provided. The memory device includes a memory cell array having a plurality of rows of memory cells, and a plurality of word lines respectively coupled to the plurality rows of memory cells. In a first pass, a row of target memory cells of the plurality of rows of memory cells is programmed, such that each of the row of target memory cells is programmed into one of $2^N/m$ intermediate levels based on one of $2^N$ pieces of N-bits data to be stored in the target memory cell, where N and m is each an integer greater than 1. In a second pass after the first pass, the row of target memory cells is programmed, such that each of the row of target memory cells is programmed into one of $2^N$ levels based on the piece of N-bits data to be stored in the target memory cell. The $2^N$ levels correspond to the $2^N$ pieces of N-bits data.

In some implementations, the intermediate level corresponds to one of $2^N/m$ intermediate threshold voltage ranges of the target memory cells, and the level corresponds to one of $2^N$ threshold voltage ranges of target memory cells. The threshold voltage range can be higher than the intermediate threshold voltage range.

In some implementations, each of the $2^N/m$ intermediate levels corresponds to m of the $2^N$ pieces of N-bits data, and the m pieces of N-bits data correspond to m of the $2^N$ levels.

In some implementations, the m levels are adjacent levels of the $2^N$ levels.

In some implementations, to program, in the first pass, a first program voltage is applied to a selected word line of the word lines, the selected word line being coupled to the row of target memory cells, and the corresponding piece of N-bits data is provided to each target memory cell.

In some implementations, to program, in the first pass, the row of target memory cells, the row of memory cells using $(2^N/m)-1$ verify voltages is verified based on the $2^N/m$ intermediate levels.

In some implementations, to verify the row of memory cells, the $(2^N/m)-1$ verify voltages are sequentially applied to a selected word line of the word lines, the selected word line being coupled to the row of target memory cells.

In some implementations, each of the $(2^N/m)-1$ verify voltages is between two adjacent intermediate levels of the $2^N/m$ intermediate levels.

In some implementations, to program, in the second pass, the row of target memory cells, the row of memory cells is verified using $2^N-1$ verify voltages based on the $2^N$ levels.

In some implementations, to verify the row of memory cells, target memory cells corresponding to m of the $2^N$ pieces of N-bits data are verified using a same one of the $(2^N/m)-1$ verify voltages.

In some implementations, the target memory cells corresponding to the m pieces of N-bits data are verified under different conditions.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a memory cell array having a plurality of rows of memory cells, each memory cell being configured to store a piece of N-bits data in one of $2^N$ levels, the level corresponding to one of $2^N$ pieces of N-bits data, where N is an integer greater than 1;
a plurality of word lines respectively coupled to the plurality rows of memory cells; and
a peripheral circuit coupled to the memory cell array through the word lines and configured to:
program, in a first pass, a row of target memory cells of the plurality of rows of memory cells, such that each of the row of target memory cells is programmed into one of $2^N/m$ intermediate levels based on the piece of N-bits data to be stored in the target memory cell, where m is an integer greater than 1; and
program, in a second pass after the first pass, the row of target memory cells, such that each of the row of target memory cells is programmed into one of the $2^N$ levels based on the piece of N-bits data to be stored in the target memory cell.

2. The memory device of claim 1, wherein
the intermediate level corresponds to one of $2^N/m$ intermediate threshold voltage ranges of the target memory cells; and
the level corresponds to one of $2^N$ threshold voltage ranges of target memory cells, the threshold voltage range being higher than the intermediate threshold voltage range.

3. The memory device of claim 1, wherein
each of the $2^N/m$ intermediate levels corresponds to m of the $2^N$ pieces of N-bits data; and the m pieces of N-bits data correspond to m of the $2^N$ levels.

4. The memory device of claim 3, wherein them levels are adjacent levels of the $2^N$ levels.

5. The memory device of claim 1, wherein to program, in the first pass, the row of target memory cells, the peripheral circuit comprises:
a word line driver configured to apply a first program voltage to a selected word line of the word lines, the selected word line being coupled to the row of target memory cells; and
a page buffer configured to provide to each target memory cell the corresponding piece of N-bits data.

6. The memory device of claim 1, wherein to program, in the first pass, the row of target memory cells, the peripheral circuit is further configured to verify the row of target memory cells using $(2^N/m)-1$ verify voltages based on the $2^N/m$ intermediate levels.

7. The memory device of claim 6, wherein to verify the row of target memory cells, the peripheral circuit comprises a word line driver configured to sequentially apply the $(2^N/m)-1$ verify voltages to a selected word line of the word lines, the selected word line being coupled to the row of target memory cells.

8. The memory device of claim 6, wherein each of the $(2^N/m)-1$ verify voltages is between two adjacent intermediate levels of the $2^N/m$ intermediate levels.

9. The memory device of claim 6, wherein to program, in the second pass, the row of target memory cells, the peripheral circuit is further configured to verify the row of memory cells using $2^N-1$ verify voltages based on the $2^N$ levels.

10. The memory device of claim 6, wherein to verify the row of memory cells, the peripheral circuit is configured to verify target memory cells corresponding to m of the $2^N$ pieces of N-bits data using a same one of the $(2^N/m)-1$ verify voltages.

11. The memory device of claim 10, wherein the target memory cells corresponding to the m pieces of N-bits data are verified under different conditions.

12. A system, comprising:
a memory device configured to store data, the memory device comprising:
a memory cell array having a plurality of rows of memory cells, each memory cell being configured to store a piece of N-bits data in one of $2^N$ levels, the level corresponding to one of $2^N$ pieces of N-bits data, where N is an integer greater than 1;
a plurality of word lines respectively coupled to the plurality rows of memory cells; and
a peripheral circuit coupled to the memory cell array through the word lines and configured to:
program, in a first pass, a row of target memory cells of the plurality of rows of memory cells, such that each of the row of target memory cells is programmed into one of $2^N/m$ intermediate levels based on the piece of N-bits data to be stored in the target memory cell, where m is an integer greater than 1; and
program, in a second pass after the first pass, the row of target memory cells, such that each of the row of target memory cells is programmed into one of the $2^N$ levels based on the piece of N-bits data to be stored in the target memory cell; and
a memory controller coupled to the memory device and configured to control the memory device.

13. A method for operating a memory device, the memory device comprising a memory cell array having a plurality of rows of memory cells, and a plurality of word lines respectively coupled to the plurality rows of memory cells, the method comprising:

program, in a first pass, a row of target memory cells of the plurality of rows of memory cells, such that each of the row of target memory cells is programmed into one of $2^N/m$ intermediate levels based on one of $2^N$ pieces of N-bits data to be stored in the target memory cell, where N and m is each an integer greater than 1; and program, in a second pass after the first pass, the row of target memory cells, such that each of the row of target memory cells is programmed into one of $2^N$ levels based on the piece of N-bits data to be stored in the target memory cell, the $2^N$ levels corresponding to the $2^N$ pieces of N-bits data.

14. The method of claim 13, wherein
the intermediate level corresponds to one of $2^N/m$ intermediate threshold voltage ranges of the target memory cells; and
the level corresponds to one of $2^N$ threshold voltage ranges of target memory cells, the threshold voltage range being higher than the intermediate threshold voltage range.

15. The method of claim 13, wherein
each of the $2^N/m$ intermediate levels corresponds to m of the $2^N$ pieces of N-bits data; and
the m pieces of N-bits data correspond to m of the $2^N$ levels.

16. The method of claim 13, wherein programming, in the first pass, the row of target memory cells comprises:
    applying a first program voltage to a selected word line of the word lines, the selected word line being coupled to the row of target memory cells; and
    providing to each target memory cell the corresponding piece of N-bits data.

17. The method of claim 13, wherein programming, in the first pass, the row of target memory cells comprises verifying the row of memory cells using $(2^N/m)-1$ verify voltages based on the $2^N/m$ intermediate levels.

18. The method of claim 17, wherein verifying the row of memory cells comprises sequentially applying the $(2^N/m)-1$ verify voltages to a selected word line of the word lines, the selected word line being coupled to the row of target memory cells.

19. The method of claim 17, wherein each of the $(2^N/m)-1$ verify voltages is between two adjacent intermediate levels of the $2^N/m$ intermediate levels.

20. The method of claim 17, wherein verifying the row of memory cells comprises verifying target memory cells corresponding to m of the $2^N$ pieces of N-bits data using a same one of the $(2^N/m)-1$ verify voltages.

* * * * *